(12) United States Patent
Yoshida (10) Patent No.: US 7,117,592 B2
(45) Date of Patent: Oct. 10, 2006

(54) METHOD OF MANUFACTURING A CONNECTOR

(75) Inventor: Shin Yoshida, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/989,958

(22) Filed: Nov. 15, 2004

(65) Prior Publication Data

US 2005/0106904 A1    May 19, 2005

(30) Foreign Application Priority Data

Nov. 18, 2003  (JP) .............................. 2003-387495

(51) Int. Cl.
*H01R 43/00* (2006.01)

(52) U.S. Cl. .......................... 29/883; 29/874; 29/884; 438/109; 438/112

(58) Field of Classification Search .................. 29/825, 29/830, 842, 843, 874, 883, 884; 438/109, 438/112

See application file for complete search history.

(56) References Cited

U.S. PATENT DOCUMENTS

| 5,808,874 | A  | * | 9/1998 | Smith .......................... 361/769 |
| 6,517,362 | B1 |   | 2/2003 | Hirai et al. |
| 6,939,474 | B1 | * | 9/2005 | Eldridge et al. ............... 216/11 |
| 6,995,041 | B1 | * | 2/2006 | Connell et al. ............. 438/112 |

* cited by examiner

*Primary Examiner*—Carl J. Arbes
(74) *Attorney, Agent, or Firm*—Beyer, Weaver & Thomas LLP.

(57) ABSTRACT

There are provided a connector capable of accomplishing electrical stability between contact members constituting the connector and a base, reduction in manufacturing cost, and simplicity in assembly and a method of manufacturing the connector. A base 11 comprises a plurality of bump portions 22 extending from the bonding surface, which contact members are bonded to, toward the opposite surface, and an insulating layer interposed between the bump portions 22. The contact members 23 are bonded to the bump portions 22. Accordingly, since the contact members 23 can be surface-mounted on the base 11, it is possible to enhance the electrical stability between the contact members 23 and the base 11.

7 Claims, 9 Drawing Sheets

METHOD OF MANUFACTURING A CONNECTOR

BACKGROUND OF THE INVENTION

1. Field of the Invention

The present invention relates to a method of manufacturing a connector such as an IC socket fitted with, for example, an IC (Integrated Circuit), etc., and more particularly to a connector capable of accomplishing electrical stability between contact members constituting the connector and a base, reduction in manufacturing cost, and simplicity in assembly, and a method of manufacturing the connector.

2. Description of the Related Art

A semiconductor inspection apparatus described in Patent Document 1 temporarily electrically connects a semiconductor device to an external circuit board, etc. A plurality of spherical contact members arranged in a lattice shape or a matrix shape is provided on the rear surface of the semiconductor device, a plurality of concave portions is provided on an insulating base opposed to the contact members, and spiral contact members are oppositely disposed in the concave portions.

Since the spiral contact members windingly come in contact with the outer surfaces of the spherical contact members by pressing the rear surface side of the semiconductor device toward the insulating base, the electrical connection between the individual spherical contact members and the individual spiral contact members is surely carried out.

[Patent Document 1] Japanese Patent Application Laid-open No. 2002-175859

The formation of the spiral contact members and the bonding of the spiral contact members to the base are carried out, for example, through the processes shown in FIGS. 15 to 18.

Figure 15:
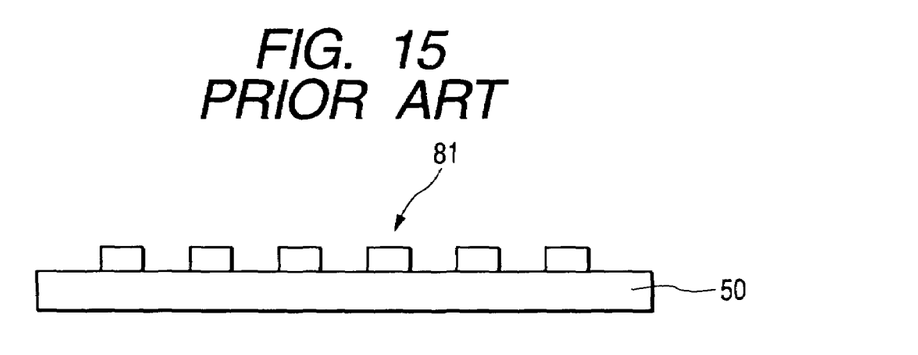
FIG. 15 is a process diagram illustrating conventional contact members and a method of providing the conventional contact members on a base.

In the process shown in FIG. 15, a resist layer not shown is deposited on a Cu substrate 80, a pattern for the spiral contact members is formed in the resist layer through exposure and development, and the contact members 81 are plated inside the pattern.

Figure 16:
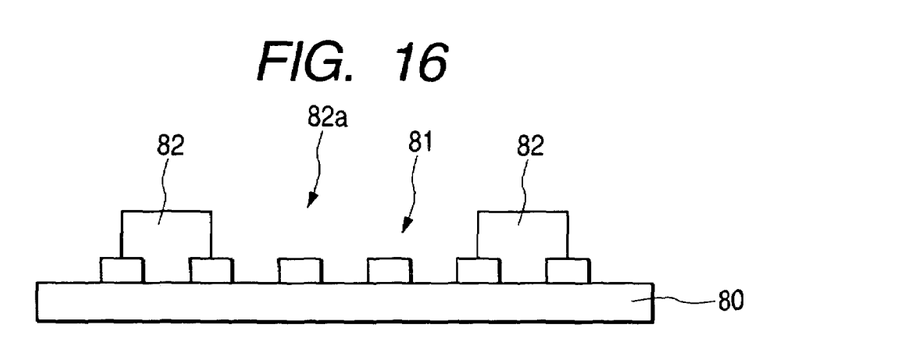
FIG. 16 is a process diagram carried out after the process shown in FIG. 15.

In the process shown in FIG. 16, a guide frame 82 is positioned such that hole portions 82a provided in the guide frame 82 are precisely opposed to the respective spiral contact members 81, and then the guide frame 82 is bonded between the respective spiral contact members 81.

Figure 17:
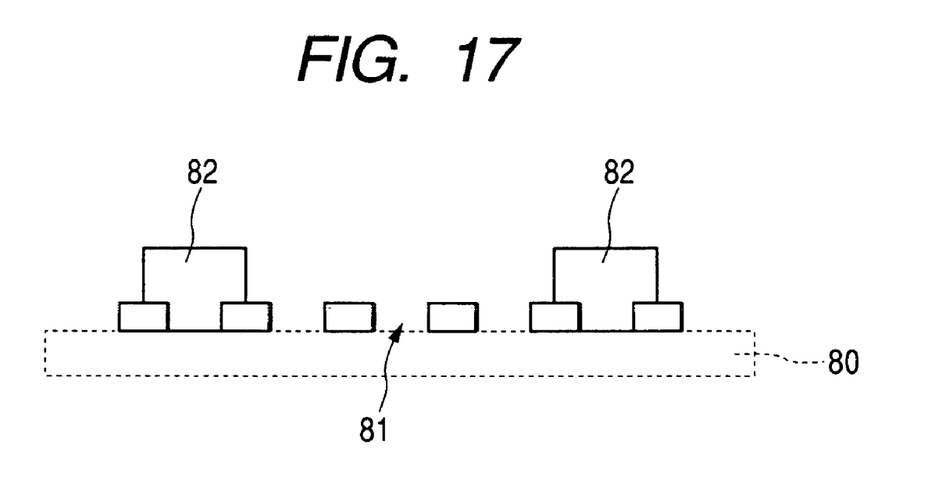
FIG. 17 is a process diagram carried out after the process shown in FIG. 16.

Next, in the process shown in FIG. 17, the Cu substrate 80 is removed, for example, using an etching method, etc.

Figure 18:
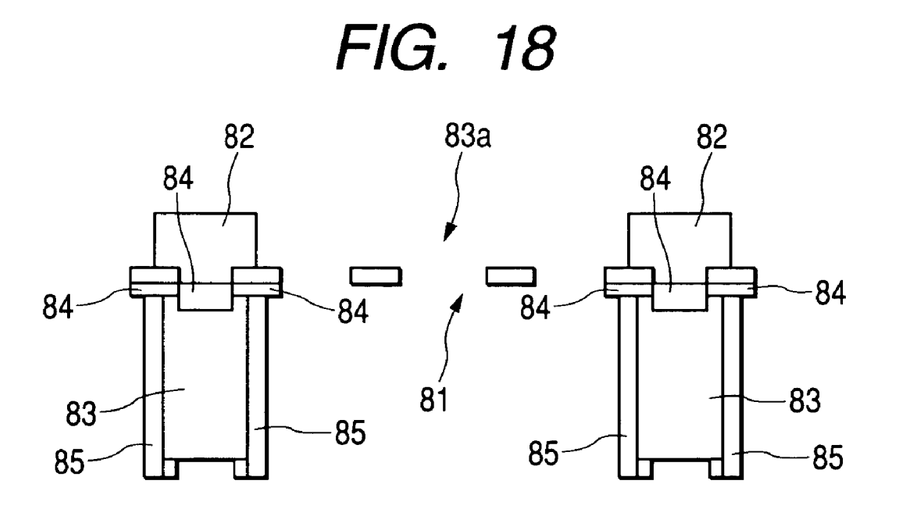
FIG. 18 is a process diagram carried out after the process shown in FIG. 17.

Next, in the process shown in FIG. 18, the spiral contact members 81 are bonded and fixed to the base 83 in which concave portions 83a are formed at the positions precisely opposed to the spiral contact members 81, using a conductive adhesive 84. A conductive material layer 85 is formed around the concave portions 83a of the base 83, for example, using a plating method or a sputtering method.

Almost the same processes as the aforementioned processes are disclosed in FIG. 37 of Patent Document 1.

However, there are the following problems in the structures themselves of the base 83 and the spiral contact members 81 shown in FIG. 18, the aforementioned process of forming the spiral contact members, and the aforementioned process of bonding the spiral contact members to the base.

First, the electrical stability between the spiral contact members and the base 11 becomes unstable. As shown in FIG. 18, the spiral contact members 81 are opposed to the concave portions 83a provided in the base 83 and the bottom portions of the spiral contact members 81 are bonded to the base 83 with a conductive adhesive 84 therebetween. In this way, since the spiral contact members 81 are opposed to the concave portions 83a of the base 83, the spiral contact members 81 cannot be surface-mounted, so that it is easy to make the electrical stability unstable between the spiral contact members 81 and the base 83 with the conductive adhesive 84 interposed therebetween. In FIG. 18, a circuit board not shown is provided under the base 83, and the spiral contact members 81 and the circuit board are electrically connected through the conductive layer 85 formed around the concave portions 83a of the base 83. However, when the electrical stability between the spiral contact members 81 and the base 83 becomes unstable as described above, the electrical stability between the spiral contact members 81 and the circuit board also becomes unstable, so that the electrical characteristics of semiconductor devices cannot be properly measured even when using the semiconductor inspection apparatus having the spiral contact members 81 and the base 83 shown in FIG. 18.

In an actual semiconductor inspection apparatus, as can be seen from FIG. 1, etc. of Patent Document 1, a plurality of spiral contact members is provided and a sheet provided with the plurality of spiral contact members is attached to the surface of the base similarly provided with a plurality of concave portions.

However, since the plurality of concave portions is provided on the surface of the base, and the sheet is very thin and can be easily deformed, it is difficult to perform uniform compression when pressing the sheet of the spiral contact members onto the base, so that it is easy to cause plural spiral contact members to have defective electrical connection to the circuit board.

Second, the base 83 to which the spiral contact members 81 are bonded is generally expensive, thereby causing increase in manufacturing cost. As described above, the base 83 is provided with the concave portions 83a and the conductive layer 85 is formed around the insides of the concave portions 83a using a plating method or sputtering method. Since the base 83 having been subjected to the complex machining in this way is an expensive purchased product and thus causes increase in manufacturing cost of the connector, it is preferable if it is possible to produce a base 83 with low price resulting from simpler machining and lower cost for material.

Third, in the process shown in FIG. 17, since the Cu substrate 80 for forming the spiral contact members 81 is completely removed using an etching process, etc., the Cu substrate 80 is required for every formation of the spiral contact members 81, and since the conductive member connecting the top portion and the bottom portion of each spiral contact member is formed out of another component, increase in cost for forming the spiral contact members 81 themselves occurs.

SUMMARY OF THE INVENTION

The present invention is contrived to solve the above problems and it is thus an object of the present invention to provide a connector capable of accomplishing electrical stability between contact members constituting the connector and a base, reduction in manufacturing cost, and simplicity in assembly and a method of manufacturing the connector.

According to the present invention, there is provided a connector having a base and a plurality of contact members provided on the base, the contact members coming in contact with a plurality of external connection terminals of an electronic component, wherein the base is provided with a plurality of bump portions extending from the bonding surface, which the contact members are bonded to, toward the opposite surface and an insulating layer is interposed between the bump portions, and wherein the contact members are provided on the bonding surface of the bump portions.

In the present invention, since the base in which a plurality of bump portions is provided and the insulating layer is filled between the bump portions, the contact members can be surface-mounted on the bump portions. Therefore, according to the present invention, the electrical stability between the contact members and the base can be improved. In addition, according to the present invention, since the contact members are provided on the bump portions, the conductor resistance can be locally minimized in comparison with the conventional case, so that it is possible to obtain excellent electrical characteristics.

In the present invention, it is preferable that the bump portions and the insulating layer form the same plane at the bonding surface side of the base. Accordingly, since the contact members can be bonded on the planarized surface, it is possible to further improve the electrical stability between the contact members and the base.

The insulating layer may be molded.

At the opposite surface side of the bonding surface of the base, it is preferable that the apexes of the bump portions are protruded more than the surface of the insulating layer and stepped portions are formed between the apexes of the bump portions and the surface of the insulating layer. In this case, since the stepped portions can serve as spaces for soldering the base and a circuit board built in the connector, it is possible to accomplish the sure connection between the base and the circuit board.

According to the present invention, there is also provided a method of manufacturing a connector which has a base and a plurality of contact members provided on the base, the contact members coming in contact with a plurality of external connection terminals of an electronic component, respectively, the method comprising: (a) a step of forming a plurality of bump portions, which extends from the front surface toward the rear surface, in a base member made of a conductive material; (b) a step of interposing an insulating layer between the bump portions and forming the base having the base member and the insulating layer; and (c) a step of bonding the contact members to the bonding surface of the bump portions to which the contact members would be bonded.

In the present invention, as described above, the bump portions are formed in the base member made of a conductive material and the insulating layer is filled between the bump portions, thereby forming the base having the base member and the insulating layer.

In the present invention, since the contact members are bonded to the bonding surface of the bump portions in the step of (c), the contact members can be surface-mounted, so that it is possible to make the assembly process of the contact members to the base easy and to manufacture a connector having excellent electrical stability with a high yield.

Since the base which was conventionally expensive is manufactured through the steps of (a) and (b), a desired base can be manufactured with lower cost and with more simplicity, so that it is possible to effectively accomplish reduction in manufacturing cost for a connector.

According to the present invention, it is preferable that the step of (a) comprises (d) a step of providing bump masks at positions where the bump portions would be formed on the surface of the base member and connecting the bump masks with connection masks; and (e) a step of allowing the bump portions extending from the front surface to the rear surface and the connection portions connecting the bump portions to remain by removing portions of the base member which are not covered with the bump masks and the connection masks from the front surface to the rear surface thereof, and that between the step of (b) and the step of (c), (f) a step of separating the bump portions by cutting out the connection portions is carried out. A plurality of bump portions is formed on the base member through the steps of (d) and (e). However, at this time, when the respective bump portions are not connected, the respective bump portions are separated at the time point of forming the bump portions. Therefore, the bump portions are connected with the connection portions and in the step of (f), the connection portions are cut out to isolate the bump portions.

In the present invention, it is preferable that in the step of (e), the base member is removed from the front surface to the rear surface using a wet etching method. As a result, it is possible to easily form a plurality of bump portions and the connection portions connecting the bump portions in the base member in desired shapes.

In the present invention, it is also preferable that in the step of (b), the insulating layer is filled between the bump portions using a molding method.

In the present invention, it is also preferable that in the step of (b), cutting grooves for cutting out the connection portions in the step of (f) are formed in the insulating layer, since the bump portions can be easily cut.

In the present invention, it is also preferable that the insulating layer and the bump portions form the same plane at the bonding surface side of the base. This is because the contact members can be bonded to the planarized surface and it is thus easy to bond the contact members onto the bump portions with uniform pressing force, so that it is possible to manufacture a connector having excellent electrical stability with a high yield.

In the present invention, it is also preferable that at the opposite surface side of the bonding surface of the base, the insulating layer is filled up to intermediate portions of the bump portions such that the apexes of the bump portions are protruded more than the surface of the insulating layer.

According to the present invention, the base comprises a plurality of bump portions extending from the bonding surface, which the contact members are bonded to, to the opposite surface thereof and the insulating layer filled between the bump portions, and the contact members are bonded onto the bump portions. As a result, since the contact members can be surface-mounted on the base, it is possible to improve the electrical stability between the contact members and the base.

According to the method of manufacturing a connector of the present invention, since the contact members can be surface-mounted on the base, the process of assembling the contact members into the base can be easily performed, so that it is possible to manufacture a connector having excellent electrical stability with a high yield.

In addition, since the base which was conventionally expensive can be manufactured in a desired shape with lower cost and more easily, it is possible to effectively accomplish reduction in manufacturing cost for a connector.

DESCRIPTION OF THE PREFERRED EMBODIMENT

Figure 1:
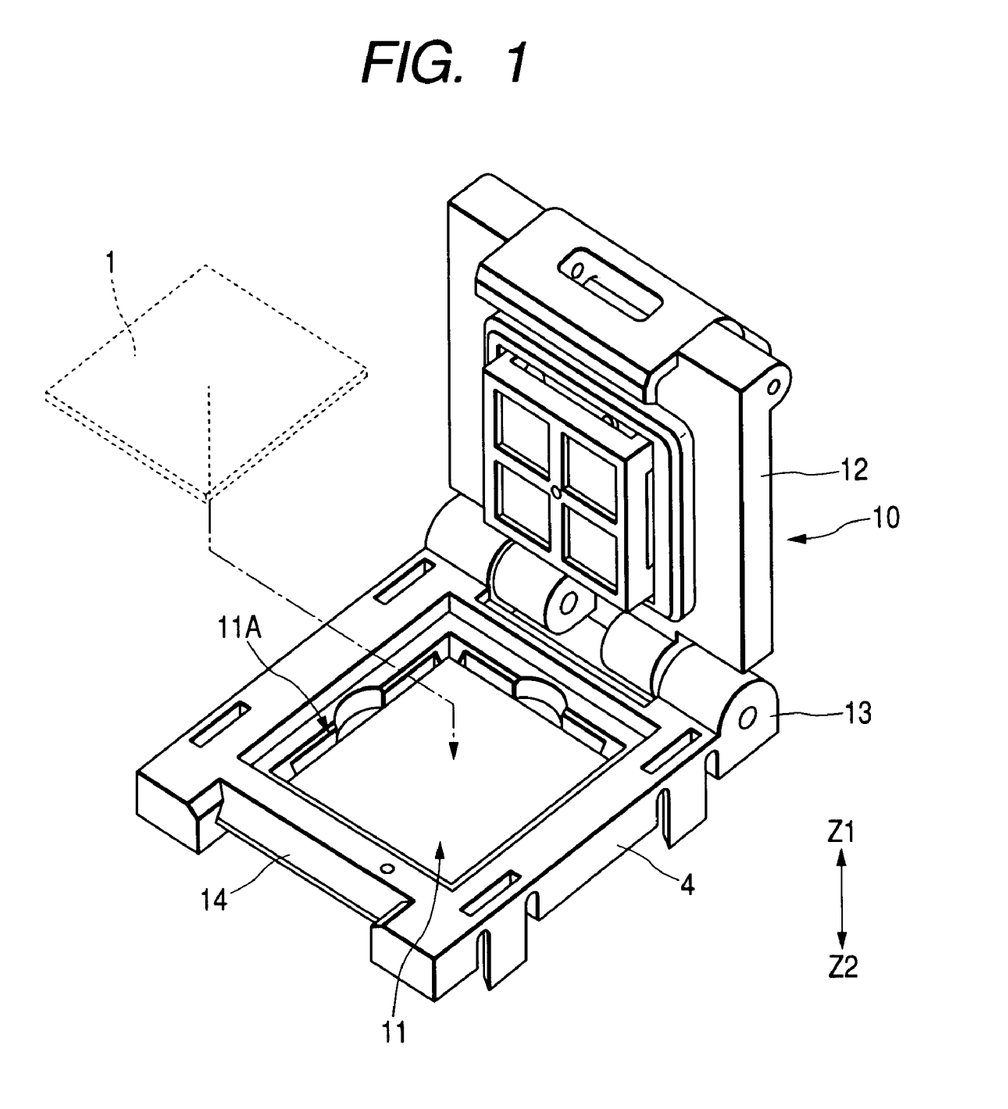
FIG. 1 is a perspective view illustrating an inspection apparatus used in a test for checking operation of an electronic component.
Figure 2:
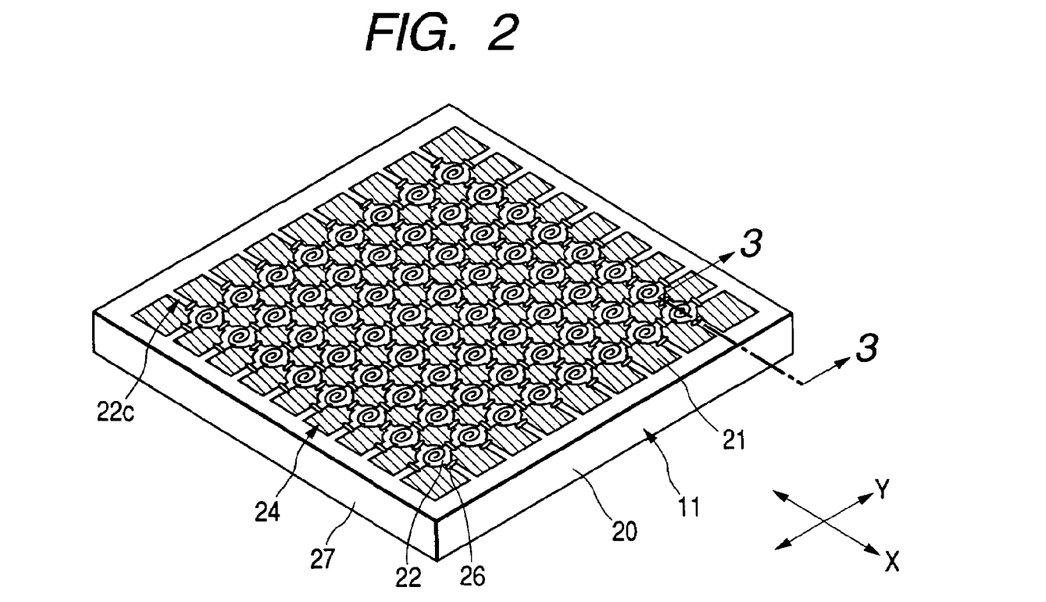
FIG. 2 is an enlarged perspective view illustrating a base shown in FIG. 1.
Figure 3:
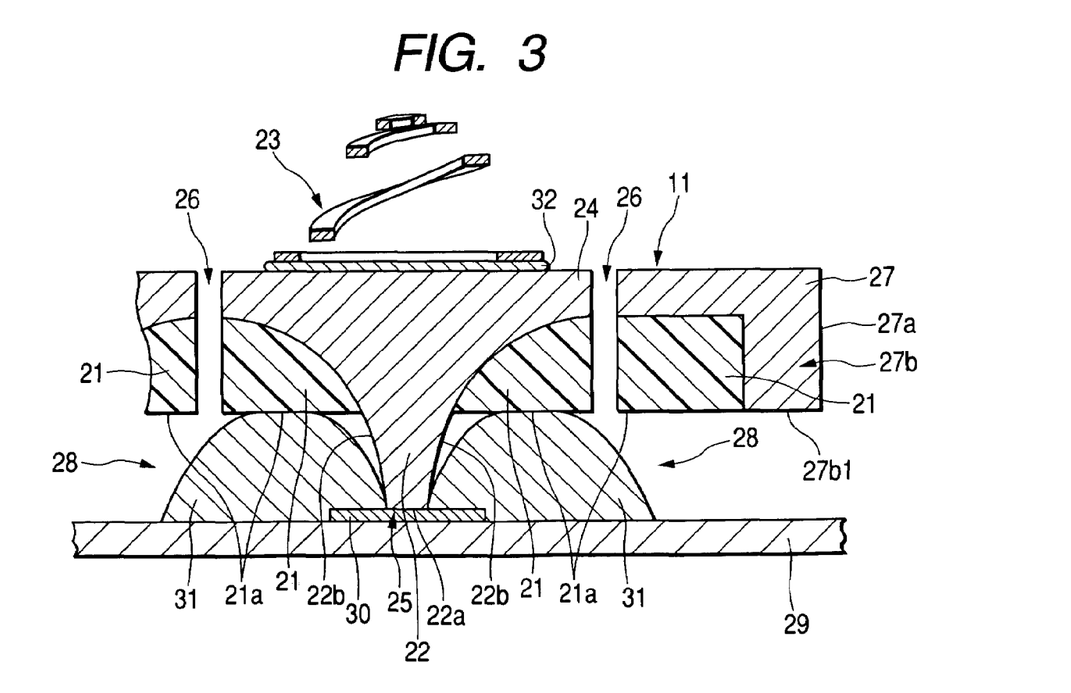
FIG. 3 is a partial cross-sectional view of the base taken along Line A of FIG. 2.

FIG. 1 is a perspective view illustrating an inspection apparatus (connector) used in a test for checking operation of an electronic component, FIG. 2 is an enlarged perspective view illustrating a base 11 shown in FIG. 1, and FIG. 3 is a partially-enlarged cross-sectional view of the base 11 taken along Line A of FIG. 2.

As shown in FIG. 1, the inspection apparatus 10 comprises a box-shaped body 4 and a lid member 12 which is rotatably supported by a hinge member 13 provided at one edge of the box-shaped body 4. A base 11 is provided at the center of the box-shaped body 4 and the surface of the base 11 serves as a mounting area 11A on which an electronic component 1 such as a semiconductor device is mounted, etc. A locked member 14 is formed at the opposite edge of the box-shaped body 4.

The inspection apparatus 10 shown in FIG. 1 serves to inspect the electronic component 1 in which a plurality of spherical contact members (external connection terminals) is in a matrix shape (in a lattice shape or a shape of check scales) on the bottom surface of the electronic component. As described later, a plurality of spiral contact members is provided on the base 11 of the inspection apparatus 10, and various electrical characteristics are measured by mounting the electronic component 1 on the base 11 and electrically connecting the spiral contact members to the external connection terminals of the electronic component 1.

Hereinafter, a structure of the base 11 will be described mainly with respect to FIGS. 2 and 3.

The base 11 comprises a base member 20 made mainly of conductive material and an insulating layer 21.

The base material 20 is made of, for example, Cu, and as shown in FIG. 2, a plurality of bump portions 22 is substantially regularly arranged on the base member 20 at a predetermined interval in the X and Y directions. In FIG. 2, cross-sections of the bump portions 22 in a direction parallel to the X-Y plane are circular, but a shape other than the circular shape, for example, a rectangular shape, etc. may be employed. In a cross-section of one bump portion 22 in a thickness (height) direction, as shown in FIG. 3, the bump portion 22 is formed with a predetermined height from the bonding surface 24 side of the base 11 (hereinafter, simply referred to as bonding surface) on which the spiral contact member 23 is formed to the opposite surface 25 side of the bonding surface 24. Hereinafter, terms of the "bonding surface" and the "opposite surface" are often used. In the description referring to FIGS. 2 and 3, the "bonding surface" indicates the front surface side of the respective members and the "opposite surface" indicates the rear surface side of the respective members.

The bump portion 22 has a shape in which the width in the width direction (in the X direction) becomes smaller from the bonding surface 24 side to the opposite surface 25 side, but is not limited to this shape. However, in the aspect that the contact area with the spiral contact members 23 is secured, it is preferable that the area of the bump portion 22 at the bonding surface 24 side is greater than the area at the opposite surface 25 side. In FIG. 3, both side surfaces 22b and 22b of the bump portion 22 are curved, but may be a linearly-inclined surface.

As shown in FIGS. 2 and 3, the respective bump portions 22 are separated. As shown in FIGS. 2 and 3, cutting grooves 26 are provided between the bump portions 22 adjacent to each other, and the cutting grooves 26 are formed out of spaces extending from the bonding surface 24 side to the opposite surface 25 side but the cutting grooves 26 may be filled with insulating material. In the respective bump portions 22, short leg portions 22c are provided in four directions on the bonding surface 24 but the leg portions 22c may be omitted. As can be clearly seen from the manufacturing method to be described later, the leg portions 22c remain as parts of connection portions having connected the bump portions during the manufacturing process.

A reference numeral 27 denotes a frame, and the frame 27 is formed as a part of the base member 20 made of the same material as the bump portions 22. As shown in FIG. 3, the frame 27 has a side portion 27b bent toward the opposite surface 25 (downwardly) from the bonding surface 24 at the side portion 27a thereof. The length of the side portion 27b toward the opposite surface 25 side is smaller than the length (height) of the bump portions 22 toward the opposite surface 25 side from the bonding surface 24, and the apex 22a of the bump portion 22 toward the opposite surface side (hereinafter, simply referred to as apex 22a) is protruded toward the opposite surface 25 side more than the opposite surface 27b1 of the side portion 27b of the frame 27.

The frame 27 is separated from the bump portions 22 through the cutting grooves 26, so that the bump portions 22 and the frame 27 are electrically separated.

As shown in FIG. 2, an insulating layer 21 is filled around the respective bump portions 22 except for the portions of the cutting grooves 26. The insulating layer 21 is, for example, molded and made of an insulating resin material such as polyimide as described in the manufacturing method later, but may be made of an inorganic insulating material.

As shown in FIG. 3, the insulating layer 21 is filled up to an intermediate portion of the side surface 22b of the bump portion 22 from the bonding surface 24 toward the opposite surface 25 side and the apex 22a of the bump portion 22 is protruded toward the opposite surface 25 side of the base 11 from the opposite surface 21a of the insulating layer 21. As a result, spaces 28 resulting from a stepped difference formed between the apex 22a of the bump portion 22 and the opposite surface 21a of the insulating layer 21 are formed at the opposite surface 25 side of the base 11. The opposite surface 21a of the insulating layer 21 forms exactly the same plane as the opposite surface 27b1 of the side portion 27b of the frame 27.

As shown in FIG. 3, the opposite surface 25 side of the base 11 is provided with a printed circuit board 29 having a plurality of wiring patterns built in the inspection apparatus 10 or other circuit components, and the base 11 is fixed to the printed circuit board 29. The surface of the printed circuit board 29 is provided with electrode portions 30, and by plane-bonding the apexes 22a of the bump portions 22 to the electrode portions 30, the electronic component 1 and the printed circuit board 29 are electrically connected to each other through the inspection apparatus 10.

In the example shown in FIG. 3 as described above, the spaces 28 are formed between the apex 22a of the bump portion 22 and the opposite surface 21a of the insulating layer 21. The spaces 28 may not be provided. However, when the spaces 28 are provided, it can be allowed to serve, for example, as the spaces 28 for soldering the base 11 and the printed circuit board 29. As shown in FIG. 3, the base 11 and the printed circuit board 29 are bonded to each other through the solder 31 injected into the spaces 28.

As shown in FIGS. 2 and 3, the spiral contact members 23 are bonded and fixed to the bonding surfaces 24 of the bump portions 22 through the conductive adhesive 32.

The spiral contact members 23 are plurally provided on an insulating sheet. The contact sheet having a plurality of spiral contact members is bonded to the bonding surface 24 of the base 11 and it is most preferable that all the spiral contact members 23 are firmly installed on the corresponding bump portions 22. However, even when the positions of several spiral contact members 23 are deviated from the corresponding bump portions 22, the inspection apparatus 10 has no problem in characteristics thereof.

In FIG. 3, the spiral contact members 23 are three-dimensionally formed upwardly in a spiral step shape, but may be two-dimensionally formed. However, the case where the spiral contact members 23 are three-dimensionally formed is more preferable in that the electrical contact with the external connection terminals of the electronic component 1 can be improved. The contact members 23 may have any shape other than the spiral shape.

As described above, in the present invention, a plurality of bump portions 22 extending from the bonding surface 24, which the spiral contact members 23 are bonded to, toward the opposite surface 25 side is provided on the base 11, the insulating layer 21 is interposed between the bump portions 22, and the spiral contact members 23 are provided on the bonding surface 24 of the bump portions 22. For this reason, in the present invention, the spiral contact members 23 can be surface-mounted, so that it is possible to enhance the electrical stability between the spiral contact members 23 and the base 11.

Since the bump portions 22 are made of a conductive bulk material, the conductor resistance can be locally minimized in comparison with the conventional case where the concave portions are provided in the base and the conductive material layer is formed around the concave portions, so that it is possible to provide an inspection apparatus 10 having an excellent electrical characteristic.

Specifically, as shown in FIG. 2, since the bump portions 22 and the insulating layer 21 can form the same plane at the bonding surface 25 side of the base 11, the pressing force between the bump portions 22 and the spiral contact members 23 can be made uniform when the spiral contact members 23 are bonded to the bump portions 22, so that it is possible to provide an inspection apparatus 10 having more excellent electrical stability.

The insulating layer 21 is preferably molded, whereby it is possible to properly fill the spaces between the bump portions 22 and it is easy to planarize the bonding surface 24 of the base 11. Therefore, it is possible to promote the manufacturing of the inspection apparatus 10 having excellent electrical stability.

As shown in FIG. 3, since the spaces 28 are formed between the apex 22a of the bump portion 22 and the opposite surface 21a of the insulating layer 21, and the spaces 28 can be used for the soldering to the printed circuit board 29, the bonding between the base 11 and the printed circuit board 29 can be easily and surely carried out.

Figure 4:
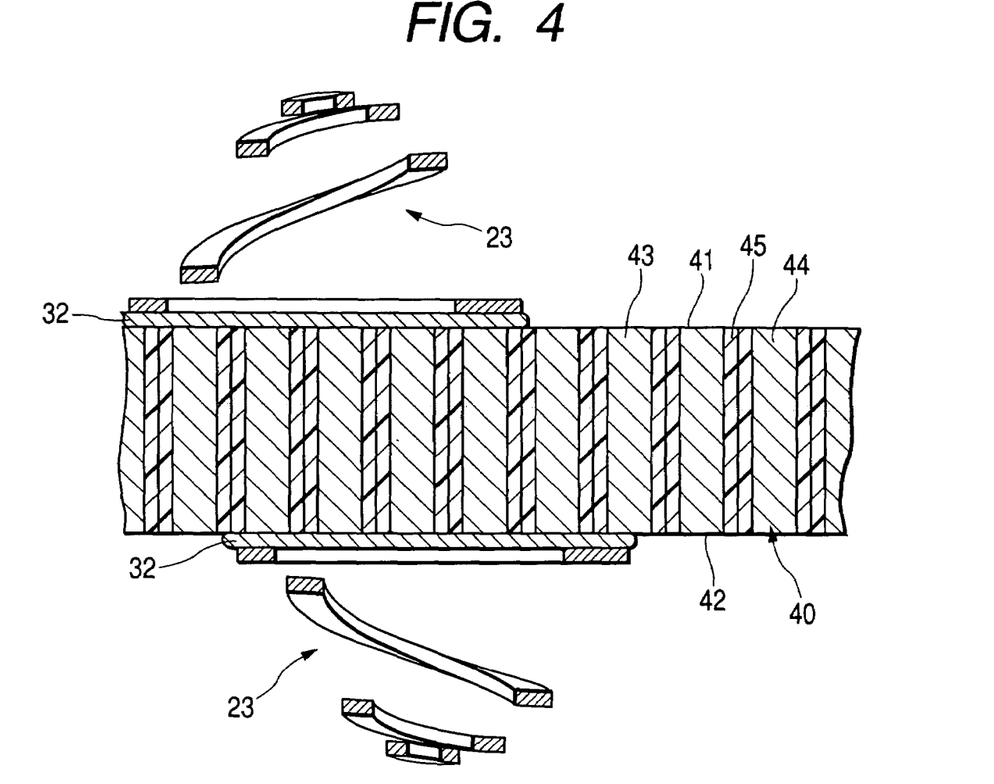
FIG. 4 is a partial cross-sectional view illustrating a base according to another embodiment of the present invention.

FIG. 4 is a partially-enlarged cross-sectional view illustrating a base 40 according to another embodiment of the present invention. As shown in FIG. 4, both the front surface and the rear surface of the base 40 serve as the bonding surfaces 41, 42 (hereinafter, the bonding surface 41 may be referred to as the "front surface" and the bonding surface 42 may be referred to as the "rear surface").

As shown in FIG. 4, the base 40 is provided with a plurality of bump portions 43 extending from the front surface 41 of the base 40 to the rear surface 42, and the bump portions 43 are exposed from the front surface 41 and the rear surface 42. Each bump portion 43 comprises a core member 44 and an insulating film 45 surrounding the core member, and the base is a plate-shaped molded product obtained by molding an insulating layer not shown. At the front surface 41 side and the rear surface 42 side of the base 40, the bump portions 43 form the same plane.

In the base 40 shown in FIG. 4, the spiral contact members 23 can be bonded to both the front surface 41 and the rear surface 42 of the base 40 through a conductive adhesive 32.

A method of manufacturing the base 11 according to the present invention will be described with reference to FIGS. 5 to 13.

Figure 5:
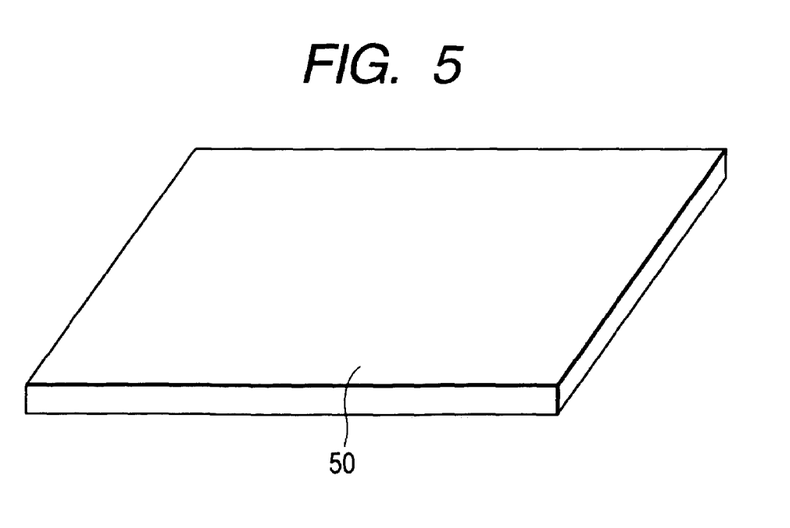
FIG. 5 is a process diagram illustrating a method of manufacturing a base according to the present invention.

A reference numeral 50 in FIG. 5 denotes a plate-shaped base member made of, for example, Cu. The base member may be made of a material other than Cu, but since the Cu base member is low in cost and is easy for performing the manufacturing process described later, the Cu base member is used here. The thickness of the base member 50 is, for example, about 200 µm.

Figure 6:
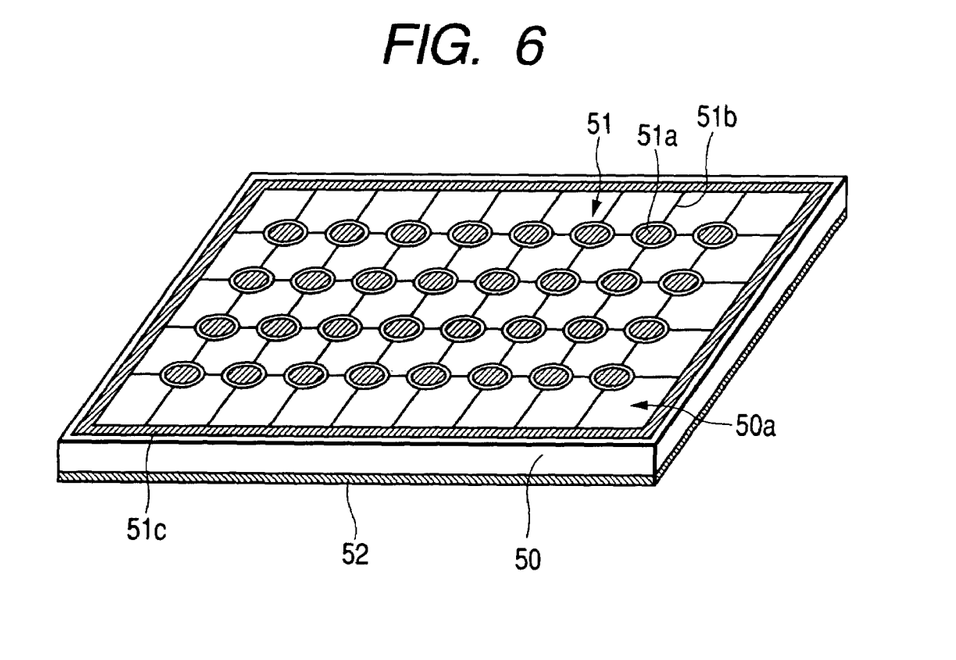
FIG. 6 is a process diagram carried out after the process shown in FIG. 5.

A mask pattern 51 made of a resist layer shown in FIG. 6 is formed on the front surface 50a of the plate-shaped base member 50 shown in FIG. 5. First, the resist layer is formed on the front surface 50a of the base member 50 using a spin coating method, etc., and the mask pattern 51 shown in FIG. 6 is then formed through exposure and development.

The mask pattern 51 shown in FIG. 6 comprises circular bump masks 51a provided at the positions where the bump portions are formed in the base member 50, line-shaped connection masks 51b for connecting the bump masks 51a, and a frame mask 51c surrounding the front surface 50a of the base member 50.

The connection masks 51b are formed, for example, in check stripes and the bump masks 51a are accurately provided at the intersections of the connection masks 51b. The connection masks 51b are also connected to the frame mask 51c.

As shown in FIG. 6, a dry film 52 for preventing the rear surface from being etched is attached to the rear surface 50b of the base member 50.

In the state shown in FIG. 6, a wet etching method is carried out from the front surface 50a of the base member 50. Since the wet etching method is isotropic, the portions of the base member 50 not covered with the mask pattern 51 are vertically etched, and the portions of the base member 50 under the mask pattern 51 are horizontally etched.

It is naturally more difficult to etch the portions of the base member 50 right under the mask pattern 51 than those the portions not covered with the mask pattern 51, but the degree with which the base member 50 under the mask pattern 51 is etched is different depending upon the width of the mask pattern.

As shown in FIG. 6, the connection masks 51b have a very small width. On the other hand, the bump masks 51a have a large width (diameter) and the frame mask 51c has a width between the width of the connection masks 51b and the width of the bump masks 51a. As a result, the portions of the base member 50 not covered with the mask pattern 51 is etched most, and the portions of the base member 50 under the connection masks 51b, the portions of the base member 50 under the frame mask 51c, and the portions of the base member 50 under the bump masks 51a are etched less in that order. As a result, the base member 50 having been subjected to the wet etching process in the FIG. 6 has the shape shown in FIG. 7.

Figure 7:
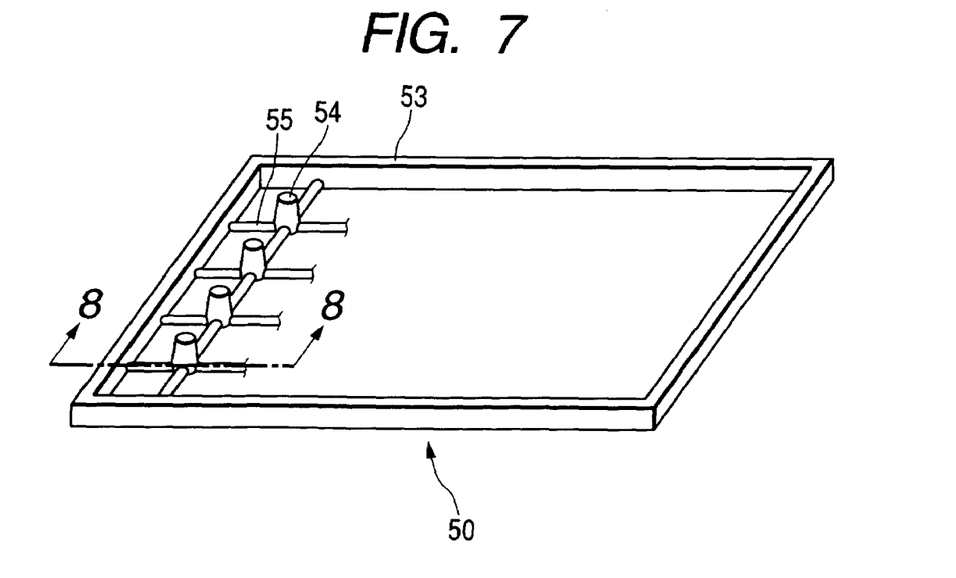
FIG. 7 is a process diagram carried out after the process shown in FIG. 6.

As shown in FIG. 7, the base member 50 comprises a frame 53, a plurality of bump portions 54 provided inside the frame 53, and connection portions 55 connecting the bump portions 54 to each other and connecting the bump portions 54 to the frame 53. The portions else become cut-out spaces.

Figure 8:
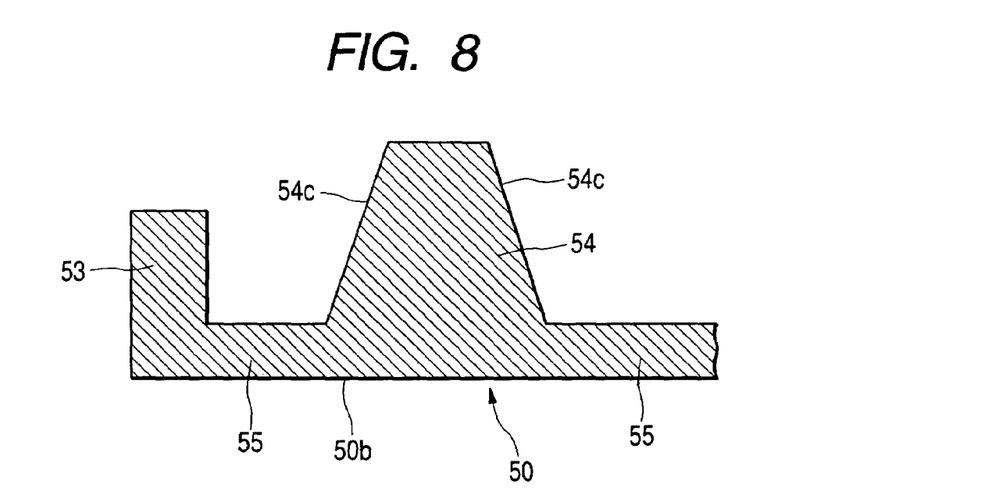
FIG. 8 is a partial cross-sectional view of the base taken along Line B—B of FIG. 7.

FIG. 8 is a partially-enlarged cross-sectional view of the base member 50 taken along Line B—B of FIG. 7 in the width direction as seen in the arrow direction. As shown in FIG. 8, the bump portion 54 is protruded the highest as seen from the rear surface 50b side of the base member 50, the frame 53 is protruded with the next height, and the connection portion 55 has the lowest height.

As shown in FIG. 8, the cross-section of the bump portion 54 in the thickness direction has a trapezoid shape. Both side surfaces 54c of the bump portion 54 in the cross-section are a linearly-inclined surface such that the width of the bump portion 54 is gradually increased from the upside to the downside, but it is not necessary to be in a linear shape and may be, for example, in a curved surface. It depends upon the conditions of the wet etching method whether it is a linearly-inclined surface of a curved surface.

Here, the rear surface 50b of the base member 50 is used as the bonding surface for the spiral contact members 23 (the front surface of the base member 50 may be used as the bonding surface). However, for the purpose of convenient description, the base member 50 shown in FIG. 7 is inverted by 180° and the next description is made using the rear surface 50b of the base member 50 in FIG. 7 as the front surface side and the front surface 50a as the rear surface side. In FIGS. 10 to 13, the front surface side of the base member 50 is referred to as the bonding surface and the rear surface side of the base member 50 is referred to as the opposite surface accordingly to the description referring to FIGS. 2 and 3.

Figure 9:
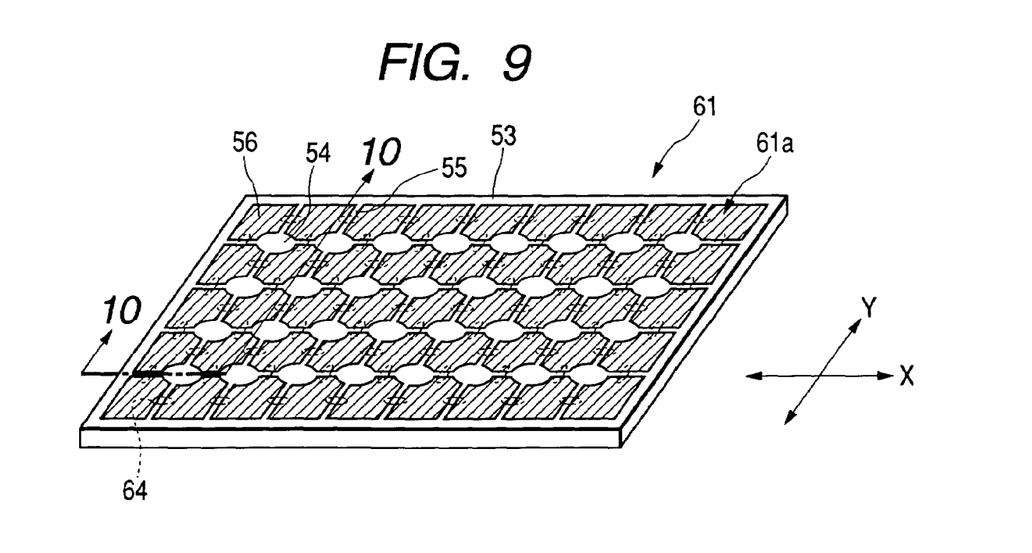
FIG. 9 is a process diagram carried out after the process shown in FIG. 7.

In FIG. 9, an insulating layer 56 (indicated by hatched lines in the figure) made of an organic insulating resin is molded between the bump portions 54 shown in FIG. 7.

Figure 10:
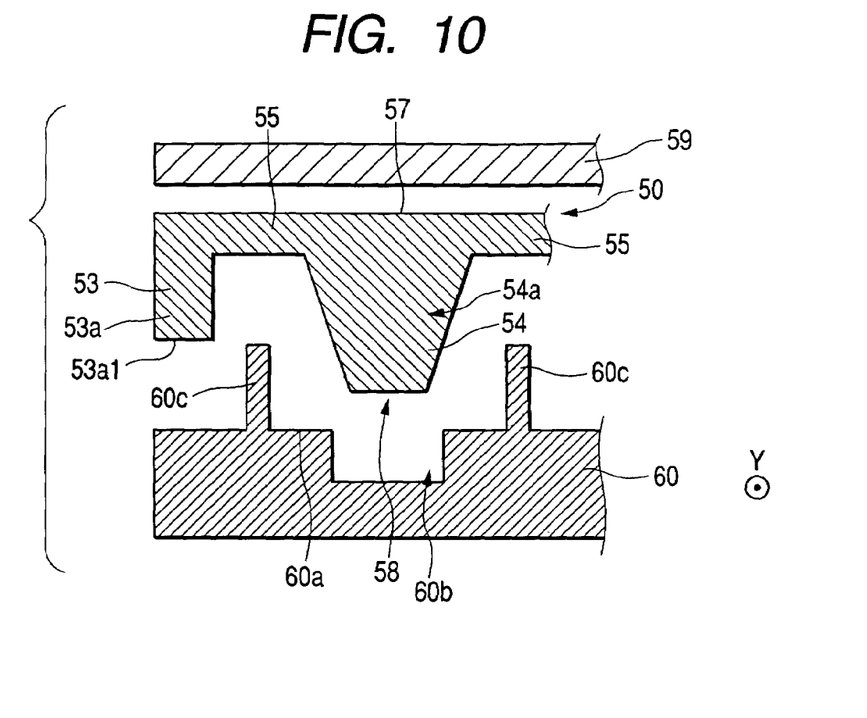
FIG. 10 is a cross-sectional view of the base taken along Line C—C of FIG. 9, which illustrates a molding.

The molding will be described in detail with reference to FIG. 10. FIG. 10 is a cross-sectional view of the base member 50 taken along Line C—C of FIG. 9, which illustrates the process of molding the insulating layer 56.

As shown in FIG. 10, from the upside of the bonding surface 57 of the base member 50 and the downside of the opposite surface 58 of the base member 50, molds 59 and 60 are disposed opposed to each other and the base member 50 is interposed between the molds 59 and 60.

As shown in FIG. 10, the mold 59 pressing the base member 50 from the upside of the bonding surface 57 is made of a plate-shaped material, and on the other hand, the surface of the mold 60 pressing the base member 50 from the downside of the opposite surface 58 is subjected to a machining in accordance with the shape of the opposite surface 58 of the base member 50.

As shown in FIG. 10, concave portions 60b are provided in the surface 60a of the mold 60 and these are spaces for receiving a part of the apexes 54a of the bump portions 54 most protruded toward the downside.

Convex protrusion portions 60c accurately provided at the positions opposed to a part of the connection portions 55 connecting the bump portions 54 to each other and connecting the bump portions 54 to the frame 53 are protruded from the surface 60a of the mold 60.

The width (in the Y direction shown in the figure) of the convex protrusion portions 60c is preferably greater than the width of the connection portions 55.

As in the next process (the process shown in FIG. 11), it is also preferable that the sizes of the respective parts are set such that when the mold 60 is made to come in contact with the opposite surface 58 of the base member 50, the surface 60a of the mold 60 comes in contact with the opposite surface 53a1 of the side portion 53a of the frame 53 and the apexes of the convex protrusion portions 60c come in contact with the opposite surface of the connection portions 55. Here, even when the apexes of the convex protrusion portions 60c do not come in contact with the opposite surface of the connection portions 55, it is necessary that the surface 60a of the mold 60 comes in contact with the opposite surface 53a1 of the side portion 53a of the frame 53. Specifically in the process shown in FIG. 11, the frame 53 serves as a positioning reference surface for allowing the mold 60 to come in contact with the base member 50, and also serves to prevent the mold 60 from jouncing.

Figure 11:
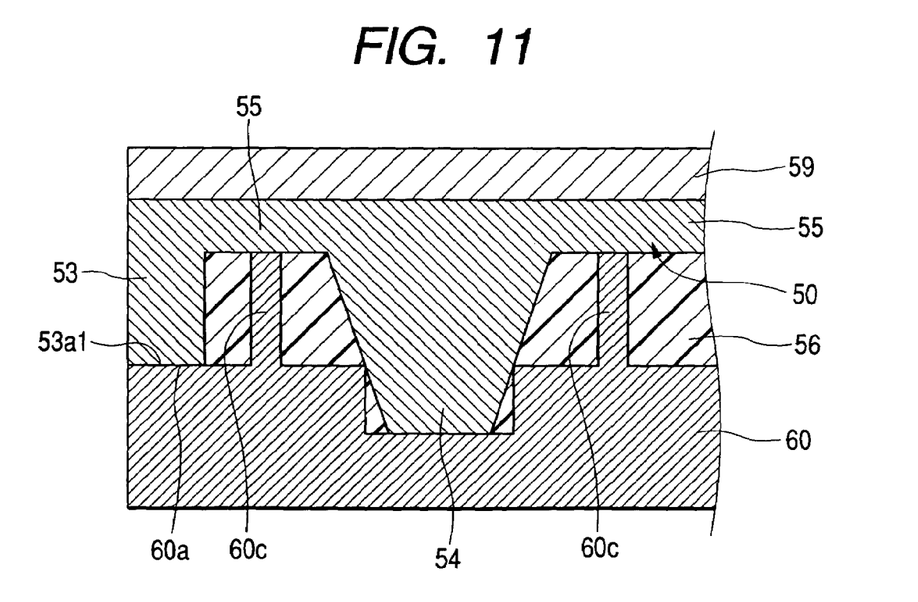
FIG. 11 is a process diagram carried out after the process shown in FIG. 10.

As shown in FIG. 11, the molds 59 and 60 are positioned in a state where the base member 50 is interposed therebetween, the spaces between the molds 59 and 60 are filled with an organic insulating resin, and the organic insulating resin is then cured through a heating process, etc.

Figure 12:
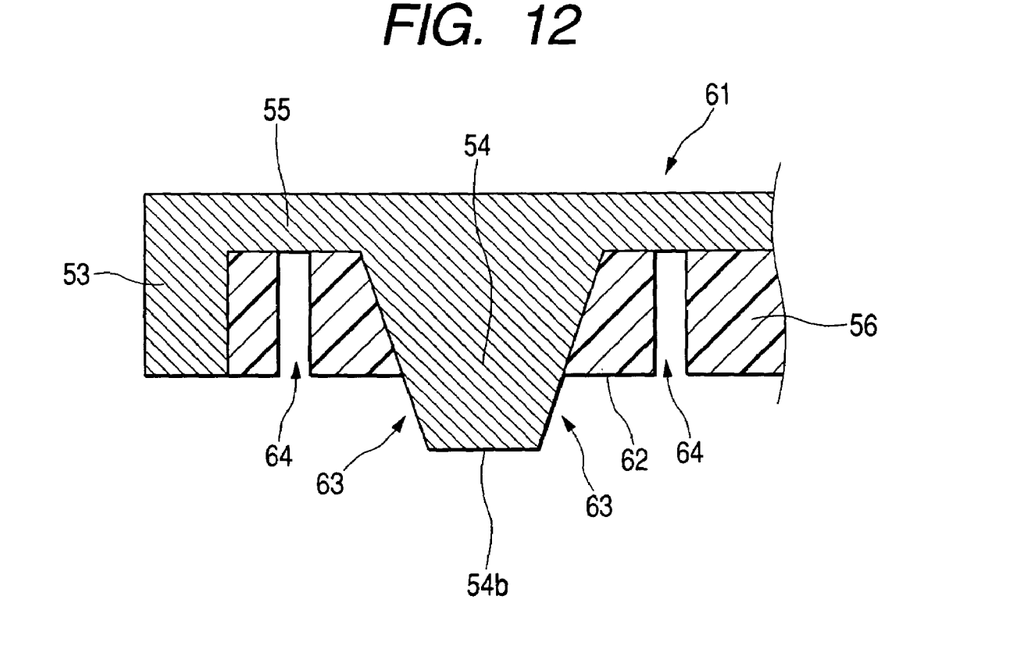
FIG. 12 is a process diagram carried out after the process shown in FIG. 11.

Then, by separating the molds 59 and 60 from the base member 50, a base 61 comprising the base member 50 and the insulating layer 56 shown in FIGS. 9 and 12 is completed.

As shown in FIG. 9, by molding the insulating layer 56, the surface of the bump portions 54 and the surface of the insulating layer 56 form the same plane at the bonding surface 61a side of the base 61. Surroundings of the bump portions 54 can be properly buried with the insulating layer 56 through the process shown in FIG. 11, and as shown in FIG. 12, by molding the insulating layer in a state where the apexes 54b of the opposite surface side (hereinafter, simply referred to as apexes 54b) of the bump portions 54 are protruded downwardly more than the opposite surface 62 of the insulating layer 56, it is possible to form spaces 63 between the apexes 54b of the bump portions 54 and the opposite surface 62 of the insulating layer 56.

As shown in FIG. 12, cutting grooves 64 extending to the opposite surface 62 of the insulating layer 56 are formed in the insulating layer 56 formed under the connection portions 55. The cutting grooves 64 are formed by allowing the organic insulating resin not to enter the positions corresponding to the convex protrusion portions 60c of the mold 60 during the process shown in FIG. 11.

Figure 13:
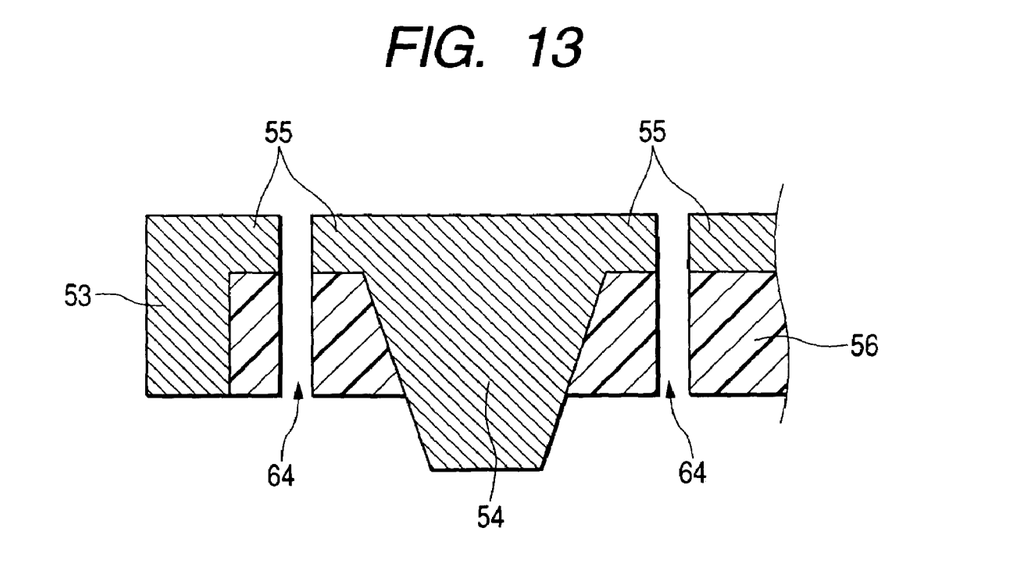
FIG. 13 is a process diagram carried out after the process shown in FIG. 12.

During the process shown in FIG. 13, the connection portions 55 are cut out along the cutting grooves 64 using an etching process, etc. By cutting out the connection portions 55 in this way, the respective bump portions 54 are separated from each other similarly to FIG. 2.

Similarly to the description referring to FIGS. 2 and 3, the spiral contact members are attached onto the bump portions 54 of the base 61 shown in FIG. 13 through a conductive adhesive. The spiral contact members are formed using a method of depositing resist, exposing and developing the resist in a spiral contact member shape, forming the spiral contact members inside the resist pattern exposed and developed using a plating method, and then removing the resist pattern, etc., a plurality of spiral contact members is attached to an insulating sheet, and the contact-member sheet having the plurality of spiral contact members is attached to the base 61 with a conductive adhesive, etc.

According to a series of processes of manufacturing the base described referring to FIGS. 5 to 13, the base 61 comprises a plurality of bump portions 54 and the insulating layer 56 inserted between the bump portions 54, so that it is possible to manufacture the base with low cost and easily.

The conventional base is relatively expensive, thereby causing increase in manufacturing cost. However, according to the present invention, the base 61 can be manufactured with lower cost and an easier method than the conventional method, thereby promoting reduction in cost.

In the present invention, by molding the insulating layer 56, the bonding surface of the base 61 can be formed in the same plane as the surface of the bump portions 54 and the surface of the insulating layer 56, and specifically, the spiral contact members can be surface-mounted on the planarized bonding surfaces of the bump portions 54, so that it is possible to easily carrying out the bonding process of the spiral contact members.

In addition, according to the present invention, since an intermediate interposed member, that is, a mother board, for forming the spiral contact members can be replaced with the Cu base member 50, it is possible to largely reduce cost for the mother board.

Further, in the present invention, the Cu base member 50 shown in FIG. 5 can be used for forming a plurality of spiral contact members and forming the contact-member sheet in which the spiral contact members are attached to the insulating sheet. The Cu base member 50 is formed with a relatively large thickness, the spiral contact members are formed on the Cu base member 50 using galvanoplatstics, etc. with a resist, the spiral contact members are attached to the insulating sheet, and then the contact-member sheet is peeled off from the Cu base member 50 using a wet etching method, etc. At this time, as described above, since the Cu base member 50 is formed with a relatively large thickness, the contact-member sheet can be removed from the Cu base member 50, even without completely removing the Cu base member 50.

Thereafter, by performing the planarization process such as clearly polishing the surface of the remaining Cu base member 50, etc. and then performing the process after the process shown in FIG. 6, the problem that the Cu base member is finally etched and cannot be reused, as described referring to the process shown in FIG. 17, can be solved. That is, in the present invention, since the Cu base member 50 can be used both for forming the spiral contact members and forming the base, the material can be used without waste, thereby causing reduction in cost.

Figure 14:
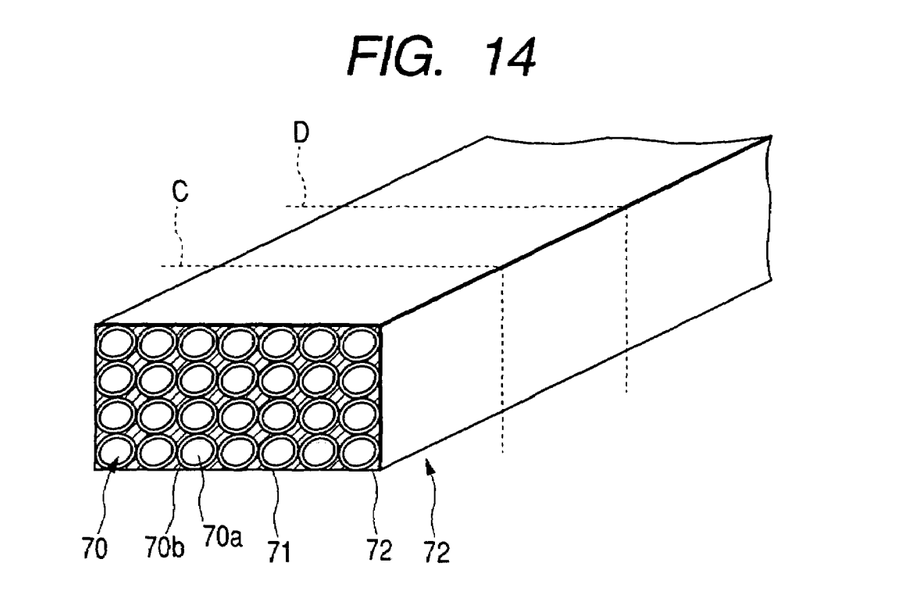
FIG. 14 is a process diagram illustrating a method of manufacturing the base shown in FIG. 4.

Next, FIG. 14 is a process diagram illustrating a method of manufacturing the base 40 according to the embodiment shown in FIG. 4. In FIG. 14, a plurality of circular wires 70 made of a conductive material is bound, the bound circular wires are inserted into a mold not shown, and then an organic insulating resin 71 is molded.

Here, each circular wire 70 comprises a core member 70a made of a conductive material and an insulating film 70b coating around the core member. This is because a part of the core member 70a becomes the bump portion 43 shown in FIG. 4, but when only the core member 70a exists, the core members 70a are electrically connected by binding a plurality of circular wires 70, so that the circular wires 70 cannot be electrically insulated each other.

As in FIG. 14, by cutting the long plate member 72 comprising a plurality of circular wires 70 and the organic insulating resin 71 along the dotted lines C and D, the base 40 having the structure shown in FIG. 4 can be formed.

What is claimed is:

1. A method of manufacturing a connector, which has a base and a plurality of contact members provided on the base, the contact members coming in contact with a plurality of external connection terminals of an electronic component, respectively, the method comprising:

(a) a step of forming a plurality of bump portions, which extends from the front surface toward the rear surface, in a base member made of a conductive material;

(b) a step of interposing an insulating layer between the bump portions and forming the base having the base member and the insulating layer; and (c) a step of bonding the contact members to the bonding surface of the bump portions to which the contact members would be bonded.

2. The method of manufacturing a connector according to claim 1, wherein the step of (a) comprises:

(d) a step of providing bump masks at positions where the bump portions would be formed on the surface of the base member and connecting the bump masks with connection masks; and (e) a step of allowing the bump portions extending from the front surface to the rear surface and the connection portions connecting the bump portions to remain by removing portions of the base member which are not covered with the bump masks and the connection masks from the front surface to the rear surface thereof, and wherein between the step of (b) and the step of (c), (f) a step of separating the bump portions by cutting out the connection portions is carried out.

3. The method of manufacturing a connector according to Claim 2, wherein in the step of (e), the base member is removed from the front surface to the rear surface using a wet etching method.

4. The method of manufacturing a connector according to claim 1, wherein in the step of (b), the insulating layer is filled between the bump portions using a molding method.

5. The method of manufacturing a connector according to claim 2, wherein when molding the insulating layer in the step of (b), cutting grooves for cutting out the connection portions in the step of (f) are formed in the insulating layer.

6. The method of manufacturing a connector according to claim 1, wherein the insulating layer and the bump portions form the same plane at the bonding surface side of the base.

7. The method of manufacturing a connector according to claim 1, wherein at the opposite surface side of the bonding surface of the base, the insulating layer is filled up to an intermediate portion of the bump portions such that the apexes of the bump portions are protruded more than the surface of the insulating layer.

* * * * *